(12) United States Patent
Nam (10) Patent No.: US 6,837,589 B2
(45) Date of Patent: Jan. 4, 2005

(54) HEATER MODULE OF RAPID THERMAL PROCESSING APPARATUS

(75) Inventor: Won-Sik Nam, Kyunggi-do (KR)

(73) Assignee: Kornic Systems Corporation, Kyunggi-Do (KR)

( * ) Notice: Subject to any disclaimer, the term of this patent is extended or adjusted under 35 U.S.C. 154(b) by 0 days.

(21) Appl. No.: 10/624,684

(22) Filed: Jul. 23, 2003

(65) Prior Publication Data

US 2004/0125593 A1 Jul. 1, 2004

(30) Foreign Application Priority Data

Nov. 1, 2002 (KR) .................................. 10-2002-0067387

(51) Int. Cl.[7] .............................................. F27D 21/02
(52) U.S. Cl. .................... 362/92; 315/115; 315/111.21; 392/418; 118/725
(58) Field of Search ........................... 315/115, 111.21; 362/92, 341; 392/418, 422, 407, 411; 118/724, 725; 219/405, 406, 416

(56) References Cited

U.S. PATENT DOCUMENTS

| | | | | |
|---|---|---|---|---|
| 5,268,989 A | * | 12/1993 | Moslehi et al. | ............. 392/418 |
| 5,345,534 A | * | 9/1994 | Najm et al. | ................. 392/422 |
| 5,951,896 A | | 9/1999 | Mahawili | ..................... 219/411 |
| 6,034,356 A | | 3/2000 | Paranjpe | ..................... 219/390 |
| 6,110,289 A | * | 8/2000 | Moore | ......................... 118/725 |

* cited by examiner

Primary Examiner—Don Wong
Assistant Examiner—Jimmy T. Vu
(74) Attorney, Agent, or Firm—Oliff & Berridge, PLC

(57) ABSTRACT

Disclosed herein is a heater module of a rapid thermal processing apparatus. The heater module comprises a heater reactor provided with reflectors, lamps, a cooling gas inlet unit, a quartz window, a quartz window fixing unit, and a cooling gas outlet unit. According to the present invention, since the lamps, reflectors and the like provided in the heater module are cooled during or after thermal processing steps, it is possible to maintain smooth operation thereof, to extend its usage life, and to reduce a preparation time of thermal processing steps. Further, as the respective reflectors adopt an independent structure for allowing the respective lamps to be installed therein in a one-on-one fashion, it is possible to achieve accurate control of a heating source. Furthermore, the lamps adopt a structure capable of effectively reflecting light emitted therefrom, resulting in an improvement in a thermal efficiency.

16 Claims, 7 Drawing Sheets

Fig. 1a
*(Prior Art)*

A-A' Sectional View

Fig. 1b
*(Prior Art)*

B-B' Sectional View

Fig. 1c
(Prior Art)

C-C' Sectional View

HEATER MODULE OF RAPID THERMAL PROCESSING APPARATUS

BACKGROUND OF THE INVENTION

1. Field of the Invention

The present invention relates to a heater module of an apparatus for rapid thermal processing, and more particularly to a heater module of a rapid thermal processing apparatus comprising cooling means for lamps, and the like.

2. Description of the Prior Art

A representative example of an apparatus for thermal processing of wafers is an apparatus for rapid thermal processing (RTP). The rapid thermal processing apparatus is used to perform rapid thermal annealing, rapid thermal cleaning, rapid thermal chemical vapor deposition, rapid thermal oxidation, and rapid thermal nitridation processes.

In a case of the rapid thermal processing apparatus, it essentially requires accurate control of temperature, since the wafer temperature is elevated or lowered over a relatively wide range within a very short period of time. For this accurate control of temperature, first of all, it has to be essentially examined whether a heater module of the rapid thermal processing apparatus is designed to uniformly supply heat to wafers. The rapid thermal processing apparatus uses halogen lamps as a heating source. Such halogen lamps have various shapes and power sources. According to the shape of the halogen lamp, a heater reactor provided in the heater module may be variously changed in shape. The heater reactor serves to fix the tungsten halogen lamps and thus allow effective use of that heating source. For this, the heater reactor is used to install reflective plates at the side surface or rear surface of the respective lamps. According to the shape of these reflective plates, distribution of temperature may be considerably altered.

Figure 1A:
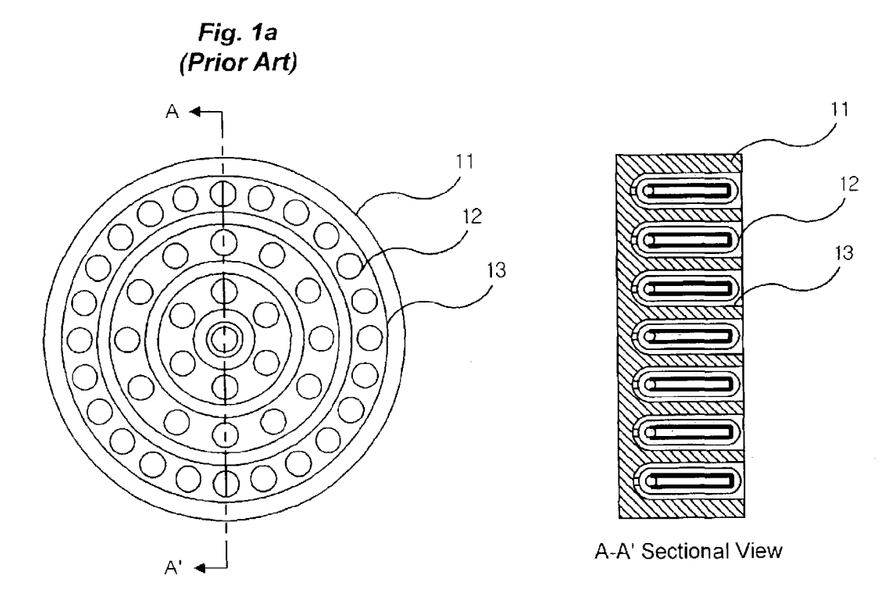
FIGS. 1a through 1c are schematic views, respectively, illustrating different embodiments of a heater module for a rapid thermal processing apparatus in accordance with the prior art.
Figure 1B:
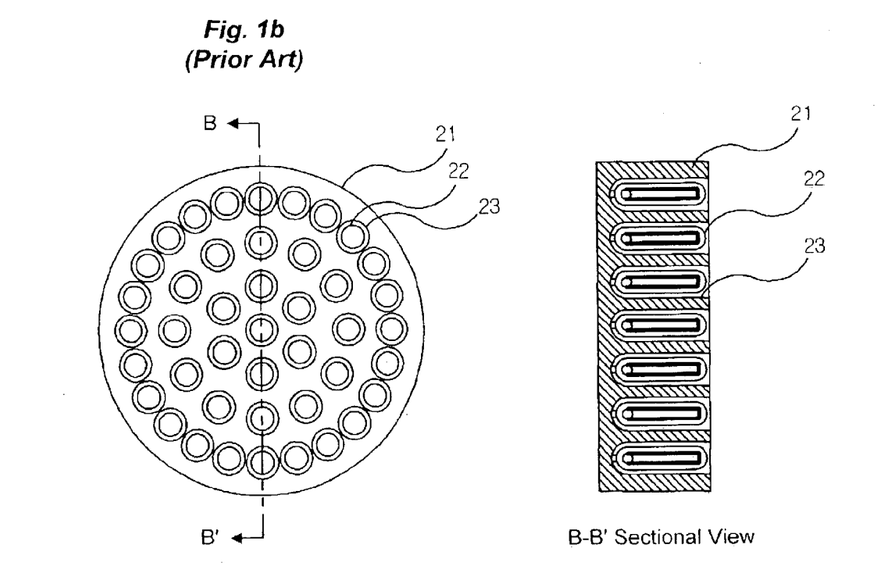
Figure 1C:
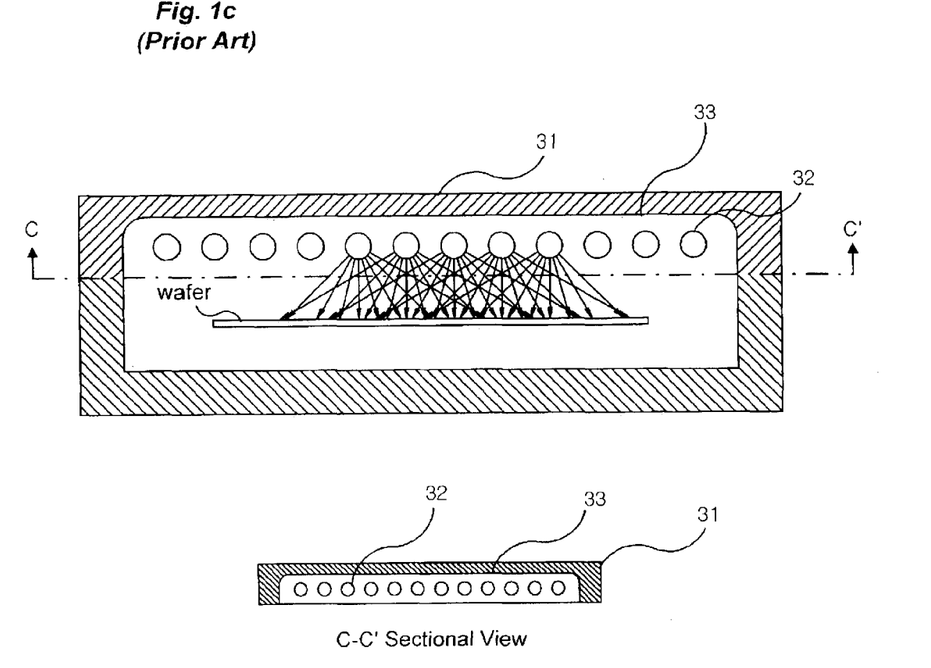

FIGS. 1a through 1c are schematic views, respectively, illustrating different embodiments of a heater module for a rapid thermal processing apparatus in accordance with the prior art.

Referring to FIG. 1a illustrating a first embodiment of a heater module according to the prior art, the heater module comprises a heater reactor 11 having a plurality of reflective plates 13, and a plurality of bulb type tungsten halogen lamps 12. The halogen lamps 12 are installed inside the heater reactor 11 in such a fashion that they form several concentric circles of different diameters while being spaced apart from one another. The respective reflective plates 13 are arranged to separate one concentric circle from another adjacent concentric circle. That is, all of light beams, emitted from the lamps 12 arranged along the same circumference of the concentric circles, are reflected by one reflective plate 13 associated therewith. Therefore, in this case, it is impossible to achieve accurate control of temperature since the temperatures of the lamps 12, positioned on the same circumference, are integrally controlled.

Referring to FIG. 1b illustrating a second embodiment of the heater module according to the prior art, the heater module comprises a plurality of bulb type lamps 22 arranged inside a heater reactor 21 to form several concentric circles of different diameters, in the same manner as the first embodiment shown in FIG. 1a. This second embodiment, however, is different from the first embodiment in that the heater reactor 21 has reflective plates 23 each having the same tubular shape as the bulb type lamps 22, and in that the lamps 22 are installed inside the heater reactor 21 in such a fashion that they correspond to respective reflective plates 23 in a one-on-one fashion, respectively, thereby being adapted to apply heat to a specific desired region. The heater module constructed as stated above has a disadvantage in that the radiation angle of the respective lamps 22 is too small, resulting in poor thermal efficiency. Therefore, the heater module of the second embodiment requires a greater amount of lamps when compared with the heater module shown in FIG. 1a. This results in increased complexity of a temperature control device and an increase in manufacturing costs of the system.

Referring to FIG. 1c illustrating a third embodiment of the heater module according to the prior art, the heater module comprises a heater reactor 31 having only one reflective plate 33, and a plurality of elongate stick type lamps 32. The stick type lamps 32 are installed inside the heater reactor 31 in such a fashion that they are positioned above a wafer in parallel to the wafer in order to improve a thermal efficiency of the lamps 32. The reflective plate 33 is adapted to reflect all of light beams emitted from all of the lamps 32. In this case, however, since the radiation angles of the light beams emitted from the respective lamps 32 are interfered and overlapped with one another, it is impossible to achieve accurate control of the temperature of a specific region.

SUMMARY OF THE INVENTION

Therefore, the present invention has been made in view of the above problems, and it is an object of the present invention to provide a heater module of an apparatus for rapid thermal processing, which enables accurate control of temperature, improves a thermal efficiency thereof, and results in an ease of use.

In accordance with the present invention, the above and other objects can be accomplished by the provision of a heater module of an apparatus for rapid thermal processing comprising: a heater reactor including a plurality of reflectors at one side thereof, and a plurality of first gas channels for communicating an inner side of the respective reflectors with the other outer side of the heater reactor, respectively; lamps installed in the respective reflectors; a cooling gas inlet unit installed at the other outer side of the heater reactor, the cooling gas inlet unit having a plurality of first cooling gas inlet openings perforated therethrough to communicate with the respective first gas channels formed at the heater reactor, respectively; a quartz window installed under the reflectors while being spaced apart from ends of the reflectors to define a second gas channel between the ends of the reflectors and a surface thereof facing the ends of the reflectors; a quartz window fixing unit for fixing the quartz window to the heater reactor; and a cooling gas outlet unit communicating with the second gas channel.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENT

Figure 2A:
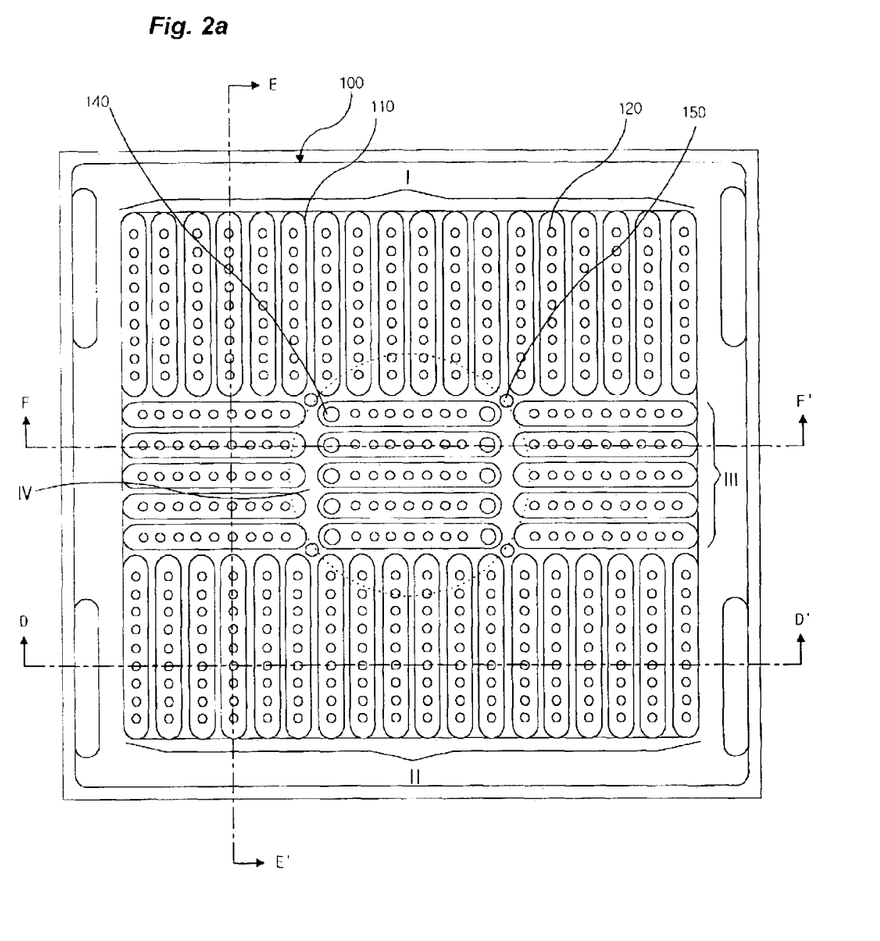
FIGS. 2a through 2g are views illustrating a heater module of a rapid thermal processing apparatus in accordance with a preferred embodiment of the present invention.
Figure 2B:
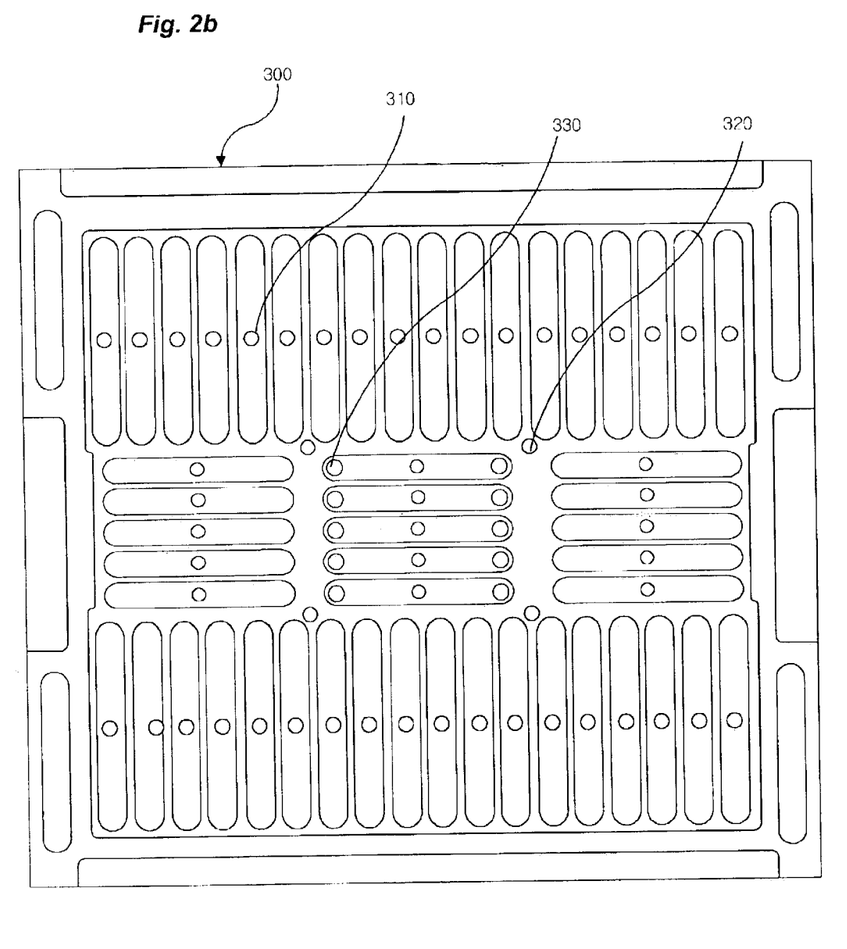
Figure 2C:
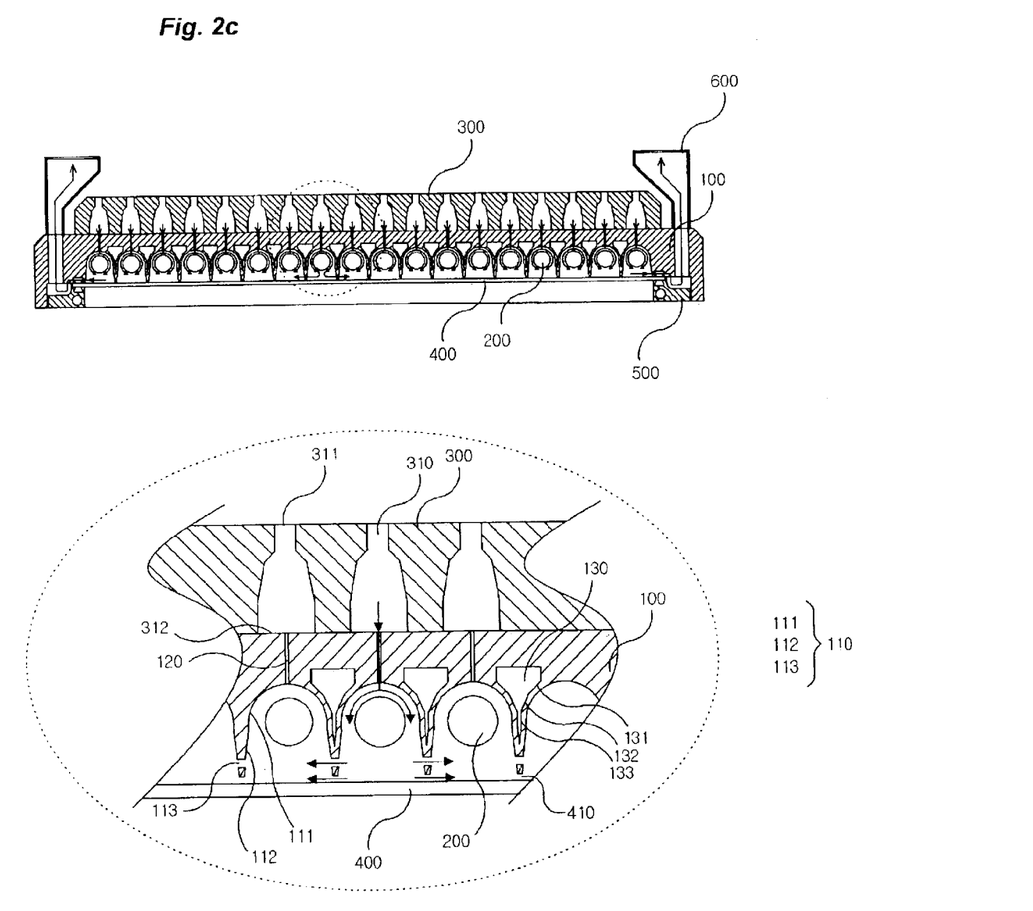
Figure 2D:
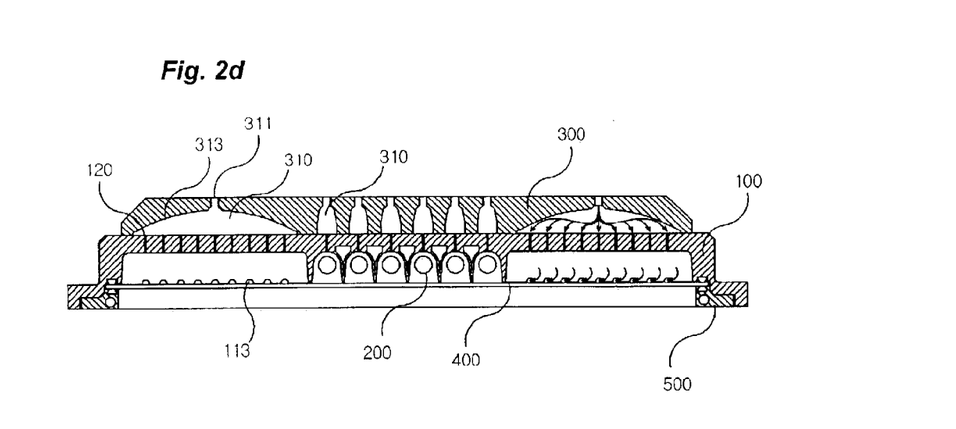
Figure 2E:
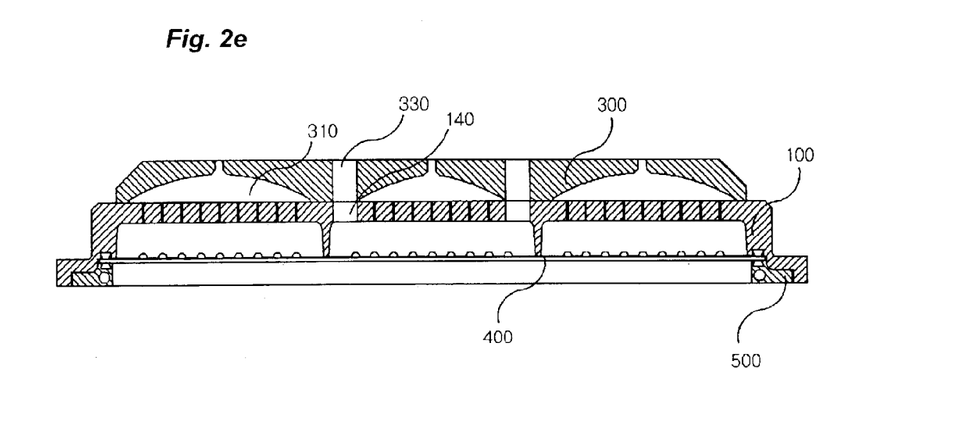
Figure 2F:
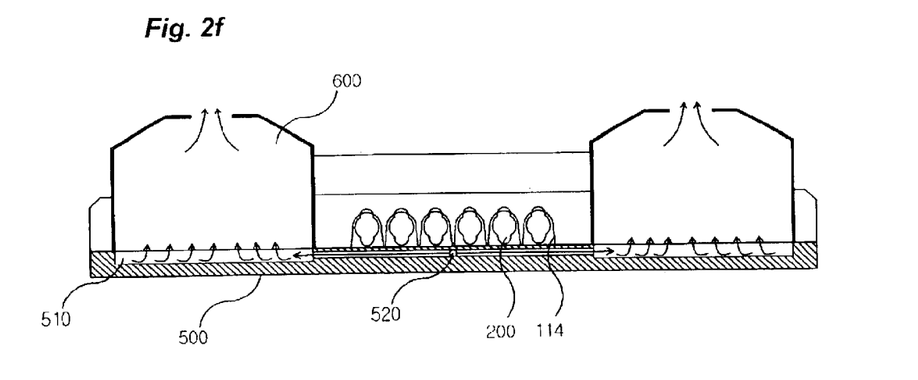
Figure 2G:
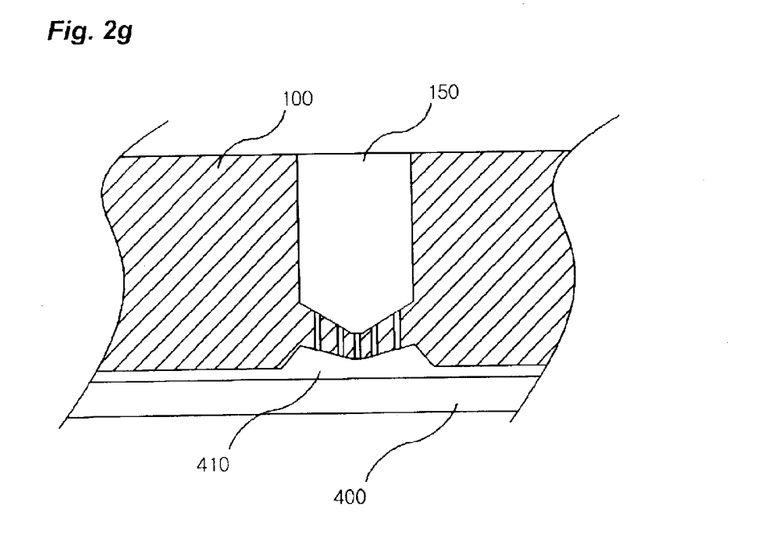

FIGS. 2a and 2b are views illustrating the whole construction of a heater module for a rapid thermal processing apparatus in accordance with a preferred embodiment of the present invention, and FIGS. 2c through 2g are views illustrating respective components of the heater module shown in FIGS. 2a and 2b. More particularly, FIG. 2a is a schematic view preponderantly illustrating the shape of the upper surface of a heater reactor, FIG. 2b is a schematic view preponderantly illustrating the shape of the upper surface of a cooling gas inlet unit, FIG. 2c is a sectional view taken along a line D-D' shown in FIG. 2a, FIG. 2d is a sectional view taken along a line E-E' shown in FIG. 2a, and FIG. 2e is a sectional view taken along a line F-F' shown in FIG. 2a. In each of the drawings, arrows indicate cooling gas paths.

Referring to FIGS. 2a through 2g, the heater module for a rapid thermal processing apparatus in accordance with the present invention comprises a heater reactor 100, a plurality of lamps 200, a cooling gas inlet unit 300, a quartz window 400, a quartz window fixing unit 500 and a cooling gas outlet unit 600.

The heater reactor 100 is engraved with a plurality of reflectors 110 at the lower side thereof, and is formed with a plurality of first gas channels 120. These gas channels 120 serve to communicate the inner side of the reflectors 110 with the upper outer side of the heater reactor 100. The respective reflectors 110 are installed therein with respective lamps 200 in a one-on-one fashion. In this case, the reflectors 110 and lamps 200 are adapted to be cooled by cooling gas entered through the first gas channels 120. If necessary, the reflectors 10 may each be provided therein with additional reflective plates or be coated at the inner surface thereof with reflective material.

The reflectors 110 are arranged to form a first reflector section I, a second reflector section II and a third reflector section III. In the first reflector section I, the respective reflectors 110 are formed in parallel to one another in a transverse direction so that the respective lamps 200 of a stick type are installed in a longitudinal direction. The second reflector section II is positioned at the opposite side to the first reflector section I in the longitudinal direction. The third reflector section III is positioned between the first reflector section I and the second reflector section II. In the third reflector section III, the respective reflectors 110 are formed in parallel to one another in the longitudinal direction so that the respective stick type lamps 200 are installed in the transverse direction. Here, the longitudinal direction and transverse direction do not mean specific directions, but only represent comparative directions perpendicular relative to each other. That is, imaginary lines extending from the stick type lamps 200 installed in the first and second reflector sections I and II are perpendicular to imaginary lines extending from the stick type lamps 200 installed in the third reflector section III.

The first and second reflector sections I and II are variable in their transverse lengths according to the size of the heater module. Alternatively, the heater module may be provided with at least two third reflector sections III, which are located at left and right sides of the heater module to face each other. In this case, it is preferable to install a fourth reflector section IV between the two third reflector sections III. The fourth reflector section IV is installed with U-shaped lamps. That is, the first to third reflector sections I, II and III located along the rim of the heater reactor 100 are installed with the stick type lamps to improve a thermal efficiency of the lamps, while the fourth reflector section IV is installed with the U-shaped lamps for convenience of installation thereof. Therefore, in order to install electrodes to be coupled with the respective U-shaped lamps, the heater reactor 100 is preferably formed with vertical perforating bores 140.

As stated above, as the lamps are arranged in a lattice shape, that is, some of the lamps are arranged in the longitudinal direction, and the other lamps are arranged in the transverse direction, it is possible to achieve uniform temperature distribution over a relatively wide area. In addition, as the U-shaped lamps are installed in a specific region where it is difficult to install the stick type lamps, the use thereof becomes easy.

Each of the reflectors 110 comprises a dome shaped upper portion 111 configured to wrap around the upper portion of the lamp 200 installed in the reflector 110, and a side wall 112 inclined to be widened downwardly from the lower end of the dome shaped upper portion 111. The reflector 110 has an elongate shape extending in one direction so as to reflect light emitted from one stick type lamp or U-shaped lamp installed therein. The respective reflectors 110 share adjacent side walls with next reflectors located at both sides thereof. In short, the respective reflectors 110 are configured to be widened downwardly from the dome shaped upper portion 111, and are continuously connected with the next reflectors 110 while sharing the associated side walls 112 located therebetween. As such, since the respective reflectors 110 adopt an independent structure for allowing the respective lamps 200 to be installed therein in a one-on-one fashion, there is no interference between the lamps in an On-state and the other lamps in an Off-state, resulting in accurate control of the lamps. In addition, as the respective reflectors have a structure capable of effectively reflecting light beams emitted from the lamps, a thermal efficiency of the lamps is improved.

The side wall 112 of the respective reflector 110 is formed with a horizontal perforating slot 113. The horizontal perforating slot 113 serves to secure smooth circulation and discharge of the cooling gas entered through the respective first gas channels 120 of the heater reactor 100.

The heater reactor 100 is further formed with water channels 130 for cooling water. The cooling water is used to cool the reflectors 110 and lamps 200. In order to enable the cooling water to effectively cool the whole portion of the respective reflectors 110 as well as to secure smooth flow thereof, the respective water channels 130 are preferably configured in such a fashion that a certain region thereof adjacent to the dome-shaped portion 111 of the respective reflectors 110 forms a curved portion 131, and another certain region adjacent to the side wall 112 of the respective reflectors 110 forms inclined portions 132 and 133, which are narrowed downwardly from the lower end of the curved portion 131.

The cooling gas inlet unit 300 is formed with a plurality of first cooling gas inlet openings 310. The first cooling gas inlet openings 310 are positioned at the upper outer side of the heater reactor 100 so that they communicate with the first gas channels 120, respectively. If a connection region between the respective first gas channels 120 and first cooling gas inlet openings 310 is formed to have an inclined surface, an opening ratio is increased, thereby achieving smooth injection of the cooling gas into the first gas channels 120 and inducing a diffusion effect in the injected cooling gas. Meanwhile, for easy installation of the U-shaped lamps as stated above, the cooling gas inlet unit 300 is preferably formed with openings 330 just above the vertical perforating bores 140 formed at the heater reactor 100.

In this case, in order to secure smooth entrance of the cooling gas into the reflectors 110, in a state wherein the respective reflectors 110 correspond to the respective cooling gas inlet openings 310 in a one-on-one fashion, the plurality of gas channels 120 are preferably provided to communicate one of the inner sides of the respective reflectors 110 with the respective first cooling gas inlet openings 310. The respective first cooling gas inlet openings 310 are configured to have two, three or more inclined surfaces for allowing the cooling gas to enter and be distributed therealong. In such a shape, as the inner cross sectional area of a cooling gas outlet end 312 of the opening 310 is larger than that of a cooling gas inlet end 311 thereof, thereby causing the interior space of the first cooling gas inlet opening 310 to serve as a certain pressure chamber. In addition, in order to enable the first cooling gas inlet opening 310 to effectively deal with irregular pressure distribution, a certain region 313 adjacent to the inlet end 311 of the first cooling gas inlet opening 310 is preferably formed to have a dome shape.

The quartz window 400 is installed under the reflectors 110 while being spaced apart from the lower ends of the reflectors 110 to define a gap 410 therebetween. Since the inlet cooling gas is discharged through the gap 410, the gap 410 will hereinafter be referred to as a second gas channel 410.

The quartz window fixing unit 500 serves to fix the quartz window 400 to the heater reactor 100.

The cooling gas outlet unit 600 communicates with the second gas channel 410.

The cooling gas entered through the first cooling gas inlet openings 310 of the cooling gas inlet unit 300 enters the first gas channels 120 formed at the heater reactor 100, thereby being used to cool the lamps 200 and the reflectors 110 heated by the light beams emitted from the lamps 200. Then, the used cooling gas flows through the second gas channel 410 and the slots 113 formed at the side walls 111 of the reflectors 110, and is discharged through the cooling gas outlet unit 600. The lamps 200 and reflectors 110, and the like are also cooled by the cooling water circulating through the water channels 130. As the lamps 200 and reflectors 110, and the like are cooled as stated above, it is possible to secure smooth operation of the lamps 200 and the like, and to extend a usage life thereof. In addition, it is possible to reduce a preparation time required to conduct repetitious thermal processing steps using a rapid thermal processing apparatus.

The heater reactor 100 is further formed with at least one third gas channel 150, which serves to communicate the upper outer side of the heater reactor 100 with the second gas channel 410 defined between the quartz window 400 and the reflectors 110. The cooling gas inlet unit 300 is further formed with at least one second cooling gas inlet opening 320 to correspond to the third gas channel 150 formed at the heater reactor 100, thereby communicating with the third gas channel 150. The cooling gas enters the second cooling gas inlet opening 320 of a higher pressure than that of the first cooling gas inlet openings 310, resulting in smooth discharge of the cooling gas. In this case, if a connection region between the second gas channel 410 and the third gas channel 150 is formed as an inclined surface, an opening ratio is increased, thereby achieving smooth injection of the cooling gas into the second gas channel 410 and inducing a diffusion effect in the injected cooling gas.

The quartz window fixing unit 500 comprises a gas collecting portion 510 formed as a groove communicating with the second gas channel 410, and a third cooling gas inlet opening 520 communicating with the second gas channel 410. The cooling gas outlet unit 600 is installed to communicate with the gas collecting portion 510. The cooling gas entered through the first cooling gas inlet openings 310 and the second cooling gas inlet opening 320 is elevated in temperature by absorbing a great amount of heat as it flows toward the cooling gas outlet unit 600, thereby adversely affecting the lamps 200 and the like. Therefore, the third cooling gas inlet opening 520 serves to allow new cooling gas to enter, and also to devise the smooth discharge of the cooling gas.

Furthermore, it is possible to increase a reflection rate by minimizing the size of openings formed at both sides of the respective reflectors in which the respective lamps are installed.

As apparent from the above description, according to a heater module of a rapid thermal processing apparatus in accordance with the present invention, since lamps, reflectors and the like provided in the heater module are cooled during or after thermal processing steps, it is possible to maintain smooth operation thereof, to extend its usage life, and to reduce a preparation time required to conduct repetitious thermal processing steps.

Further, according to the present invention, the respective reflectors adopt an independent structure for allowing the respective lamps to be installed in a one-on-one fashion. This enables accurate control of a heating source. In addition, as the respective reflectors have a structure capable of effectively reflecting light emitted from the lamps, it is possible to improve a thermal efficiency of the lamps.

Furthermore, as the lamps of a stick type are arranged in a lattice form, it is possible to achieve uniform temperature distribution over a relatively wide region. In addition, as the U-shaped lamps are installed in a specific region difficult to install the stick type lamps, the use thereof becomes easy.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A heater module of an apparatus for rapid thermal processing comprising:

a heater reactor including a plurality of reflectors at one side thereof, and a plurality of first gas channels for communicating an inner side of the respective reflectors with the other outer side of the heater reactor, respectively;

lamps installed in the respective reflectors;

a cooling gas inlet unit installed at the other outer side of the heater reactor, the cooling gas inlet unit having a plurality of first cooling gas inlet openings perforated therethrough to communicate with the respective first gas channels formed at the heater reactor, respectively;

a quartz window installed under the reflectors while being spaced apart from ends of the reflectors to define a second gas channel between the ends of the reflectors and a surface of the window facing the ends of the reflectors;

a quartz window fixing unit for fixing the quartz window to the heater reactor; and a cooling gas outlet unit communicating with the second gas channel.

2. The heater module as set forth in claim 1, wherein the heater reactor is provided therein with water channels of cooling water.

3. The heater module as set forth in claim 1, wherein in a state in which the respective reflectors correspond to the respective first cooling gas inlet openings in a one-on-one fashion, the first gas channels are formed in large number at the heater reactor for communicating the inner side of the respective reflectors with the corresponding first cooling gas inlet opening.

4. The heater module as set forth in claim 1, wherein each of the first cooling gas inlet openings has a larger inner cross sectional area at a cooling gas outlet end thereof than a cooling gas inlet end thereof for diffusion of inlet cooling gas.

5. The heater module as set forth in claim 3, wherein each of the first cooling gas inlet openings has a larger inner cross sectional area at a cooling gas outlet end thereof than a cooling gas inlet end thereof for diffusion of inlet cooling gas.

6. The heater module as set forth in claim 4, wherein the respective first cooling gas inlet opening have a certain region of a dome shape adjacent to the cooling gas inlet end thereof.

7. The heater module as set forth in claim 5, wherein the respective first cooling gas inlet opening have a certain region of a dome shape adjacent to the cooling gas inlet end thereof.

8. The heater module as set forth in claim 1, wherein the respective reflectors comprise a dome shaped portion, and a side wall inclined to be widened outwardly from an end of the dome shaped portion adjacent thereto, the respective reflectors sharing adjacent side walls with next reflectors located at both sides thereof.

9. The heater module as set forth in claim 8, wherein the side walls of the reflectors are formed with a horizontal perforating slot, respectively.

10. The heater module as set forth in claim 8, wherein the heater reactor is provided therein with water channels of cooling water for cooling the reflectors, the respective water channels being configured so that a certain region thereof adjacent to the dome shaped portion of the respective reflectors forms a curved portion, and another certain region adjacent to the side wall of the respective reflectors forms inclined portions, which are inclined inwardly toward each other from an end of the curved portion adjacent thereto, thereby allowing the cooling water to flow over a whole portion of the side wall.

11. The heater module as set forth in claim 9, wherein the heater reactor is provided therein with water channels of cooling water for cooling the reflectors, the respective water channels being configured so that a certain region thereof adjacent to the dome shaped portion of the respective reflectors forms a curved portion, and another certain region adjacent to the side wall of the respective reflectors forms inclined portions, which are inclined inwardly toward each other from an end of the curved portion adjacent thereto, thereby allowing the cooling water to flow over a whole portion of the side wall.

12. The heater module as set forth in claim 1, wherein the heater reactor comprises:
   a first reflector section, in which the reflectors are formed in parallel to one another in a transverse direction so that the respective lamps of a stick type are installed in a longitudinal direction;
   a second reflector section positioned at an opposite side to the first reflector section in the longitudinal direction; and
   a third reflector section positioned between the first reflector section and the second reflector section, in the third reflector section, the reflectors being formed in parallel to one another in the longitudinal direction so that the respective stick type lamps are installed in the transverse direction.

13. The heater module as set forth in claim 12, wherein the third reflector section includes at least two third reflector sections provided to face each other in the transverse direction, and
   wherein the heater reactor further comprises:
   a fourth reflector section between the two third reflector sections, in which U-shaped lamps are installed.

14. The heater module as set forth in claim 13, wherein the heater reactor is formed with vertical perforating bores in order to install electrodes to be coupled with the respective U-shaped lamps, respectively.

15. The heater module as set forth in claim 1, wherein the heater reactor is further provided with at least one third gas channel for communicating the second gas channel with the other outer side of the heater reactor; and
   wherein the cooling gas inlet unit is formed with at least one second cooling gas inlet opening to correspond to the third gas channel formed at the heater reactor in a one-on-one fashion.

16. The heater module as set forth in claim 1, wherein the quartz window fixing unit comprises a gas collecting portion communicating with the second gas channel, and a third cooling gas inlet opening communicating with the second gas channel; and
   wherein the cooling gas outlet unit communicates with the gas collecting portion.

\* \* \* \* \*